(12) United States Patent
Li et al.

(10) Patent No.: US 9,461,070 B2
(45) Date of Patent: Oct. 4, 2016

(54) THIN FILM TRANSISTOR, METHOD FOR MANUFACTURING THE SAME, AND DEVICE COMPRISING THE SAME

(71) Applicant: BOE TECHNOLOGY GROUP CO., LTD., Beijing (CN)

(72) Inventors: Yanzhao Li, Beijing (CN); Gang Wang, Beijing (CN); Jingang Fang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 1 day.

(21) Appl. No.: 14/377,946

(22) PCT Filed: Dec. 11, 2013

(86) PCT No.: PCT/CN2013/089030
§ 371 (c)(1),
(2) Date: Aug. 11, 2014

(87) PCT Pub. No.: WO2014/206021
PCT Pub. Date: Dec. 31, 2014

(65) Prior Publication Data
US 2015/0318309 A1  Nov. 5, 2015

(30) Foreign Application Priority Data

Jun. 28, 2013  (CN) .......................... 2013 1 0269381

(51) Int. Cl.
*H01L 35/24* (2006.01)
*H01L 27/12* (2006.01)
(Continued)

(52) U.S. Cl.
CPC ..... *H01L 27/1222* (2013.01); *H01L 21/02521* (2013.01); *H01L 21/02543* (2013.01);
(Continued)

(58) Field of Classification Search
CPC .............. H01L 27/1222; H01L 21/02631; H01L 21/324; H01L 29/20; H01L 21/02521; H01L 29/786; H01L 21/02592; H01L 21/02543; H01L 29/66969; H01L 29/24; H01L 29/78696; H01L 21/461; H01L 27/1259; H01L 29/66742; H01L 29/04
See application file for complete search history.

(56) References Cited

U.S. PATENT DOCUMENTS

| | | |
|---|---|---|
| 4,065,781 A | 12/1977 | Gutknecht |
| 5,536,953 A | 7/1996 | Dreifus et al. |

(Continued)

FOREIGN PATENT DOCUMENTS

| | | |
|---|---|---|
| CN | 101136312 A | 3/2008 |
| CN | 101960605 A | 1/2011 |

(Continued)

OTHER PUBLICATIONS

Hafez et al., Pulsed laser deposition of InP thin films on sapphire(1000) and GaAs(100), 2004, Science Direct, Elsevier, Applied Surface Science 233 (2004) pp. 42-50.*

(Continued)

*Primary Examiner* — Steven Loke
*Assistant Examiner* — Samuel Park
(74) *Attorney, Agent, or Firm* — Collard & Roe, P.C.

(57) ABSTRACT

A thin film transistor is provided. An active layer (3) of the thin film transistor is made of an amorphous phosphide semiconductor material. Due to high carrier mobility of the phosphide semiconductor material, a thin film transistor with a high carrier mobility can be obtained by employing the amorphous phosphide semiconductor material to prepare the active layer of the thin film transistor. A method for manufacturing such a thin film transistor, and an array substrate and a display panel each comprising such a thin film transistor, are further provided.

3 Claims, 3 Drawing Sheets

(51) Int. Cl.
- H01L 29/786 (2006.01)
- H01L 29/66 (2006.01)
- H01L 29/24 (2006.01)
- H01L 29/20 (2006.01)
- H01L 29/04 (2006.01)
- H01L 21/02 (2006.01)
- H01L 21/477 (2006.01)
- H01L 21/461 (2006.01)
- H01L 21/324 (2006.01)

(52) U.S. Cl.
CPC ... *H01L21/02592* (2013.01); *H01L 21/02631* (2013.01); *H01L 21/324* (2013.01); *H01L 21/461* (2013.01); *H01L 21/477* (2013.01); *H01L 27/1259* (2013.01); *H01L 29/04* (2013.01); *H01L 29/20* (2013.01); *H01L 29/24* (2013.01); *H01L 29/66742* (2013.01); *H01L 29/66969* (2013.01); *H01L 29/786* (2013.01); *H01L 29/78681* (2013.01); *H01L 29/78693* (2013.01); *H01L 29/78696* (2013.01); *H01L 21/02565* (2013.01)

(56) References Cited

U.S. PATENT DOCUMENTS

| | | | |
|---|---|---|---|
| 2008/0057605 A1 | 3/2008 | Morisue et al. | |
| 2011/0018033 A1 | 1/2011 | Takenaka et al. | |
| 2011/0031496 A1 | 2/2011 | Yamazaki et al. | |
| 2011/0121296 A1 | 5/2011 | Auman et al. | |
| 2014/0034924 A1* | 2/2014 | Kawata | H01L 51/0072 257/40 |
| 2014/0103409 A1* | 4/2014 | Kakehata | H01L 21/76254 257/290 |

FOREIGN PATENT DOCUMENTS

| | | |
|---|---|---|
| CN | 101996989 A | 3/2011 |
| CN | 102074480 A | 5/2011 |
| JP | 60251666 A | 12/1985 |

OTHER PUBLICATIONS

International Search Report, International Preliminary Report on Patentability and Written Opinion of the International Searching Authority of PCT/CN2013/089030 in Chinese, mailed Apr. 30, 2014.

Kunze et al., First demonstration of low temperature grown InP-channel HFET transferred onto GaAs substrate, Solid-State Electronics 43, (1999), pp. 1535-154.

English translation of the Written Opinion of the International Searching Authority of PCT/CN2013/089030, mailed Apr. 3, 2014.

Second Chinese Office Action of Chinese Application No. 201310269381.9, mailed Aug. 14, 2015 with English translation.

Chinese Office Action of Chinese Application No. 201310269381.9, mailed Apr. 27, 2015 with English translation.

English Translation of the International Search Report of PCT/CN2013/089030 published in English on Dec. 31, 2015.

\* cited by examiner

THIN FILM TRANSISTOR, METHOD FOR MANUFACTURING THE SAME, AND DEVICE COMPRISING THE SAME

CROSS REFERENCE TO RELATED APPLICATIONS

This application is the National Stage of PCT/CN 2013/089030 filed on Dec. 11, 2013, which claims priority under 35 U.S.C. §119 of Chinese Application No. 201310269381.9 filed on Jun. 28, 2013, the disclosure of which is incorporated by reference.

TECHNICAL FIELD

Embodiments of the present disclosure relate to a field of a display technology, specifically to a thin film transistor, a method for manufacturing the same and a device comprising the same.

BACKGROUND

With development of the panel display industry, requirement on the display panel is getting higher and higher, wherein requirement on mobility of a thin film transistor in the panel is getting higher. Currently, an existing thin film transistor (TFT) is usually a amorphous silicon thin film transistor, an active layer of which is amorphous silicon material. The amorphous silicon thin film transistor has a low electron mobility of 0.1-1 $cm^2V^{-1}s^{-1}$, which cannot meet the demand of technology development. Therefore, low temperature poly silicon (LTPS) thin film transistors and oxide thin film transistors are researched and developed.

The LTPS thin film transistor is a thin film transistor with an active layer made of low temperature poly silicon material. The low temperature poly silicon is obtained by converting amorphous silicon into poly silicon at a low temperature. The LTPS thin film transistor has a high carrier mobility up to about 100-500 $cm^2V^{-1}s^{-1}$, however, its uniformity is poor and thus an insurmountable problem occurs when the thin film transistor is applied to a big-size panel. The oxide thin film transistor is a thin film transistor with an active layer made of an oxide semiconductor material, which ensures a good big-size uniformity while sacrificing carrier mobility to some extent, and at present, under premise of ensuring a good uniformity, the carrier mobility of the oxide thin film transistor can reach up to 10 $cm^2V^{-1}s^{-1}$. However, the carrier mobility of the oxide thin film transistor can not meet the development of the panel display technology any longer. Therefore, the carrier mobility of current thin film transistors needs to be further improved under good uniformity.

SUMMARY

In order to address the above problem, embodiments of the present disclosure provide a thin film transistor with high carrier mobility. Embodiments of the present disclosure also provide a method for manufacturing the thin film transistor and a relevant device comprising such a thin film transistor.

Embodiments of the present disclosure provide a thin film transistor comprises: a base substrate, and a gate, an active layer, a source and a drain formed on the base substrate, wherein the active layer is made of an amorphous phosphide semiconductor material.

Embodiments of the present disclosure provide a display panel comprising the array substrate according to the embodiment of the present disclosure.

Embodiments of the present disclosure provide a method for manufacturing the above thin film transistor, the active layer of the thin film transistor is prepared by means of magnetron sputtering, pulsed laser deposition, chemical vapor deposition or solution deposition.

The active layer of the thin film transistor according to the embodiment of the present disclosure is made of amorphous phosphide semiconductor material. Since the phosphide semiconductor material has a high carrier mobility, compared to conventional thin film transistors, the active layer of which is made of amorphous silicon, poly silicon, microcrystalline silicon or oxide semiconductor material, it is possible to obtain a thin film transistor with a higher carrier mobility by employing amorphous phosphide semiconductor material to prepare the active layer of the thin film transistor.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the invention and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

A thickness and a shape of each layer of the thin film in figures, which are just intended to illustrate contents of embodiments of the present disclosure, does not reflect actual scales of the thin film transistor.

Figure 1:
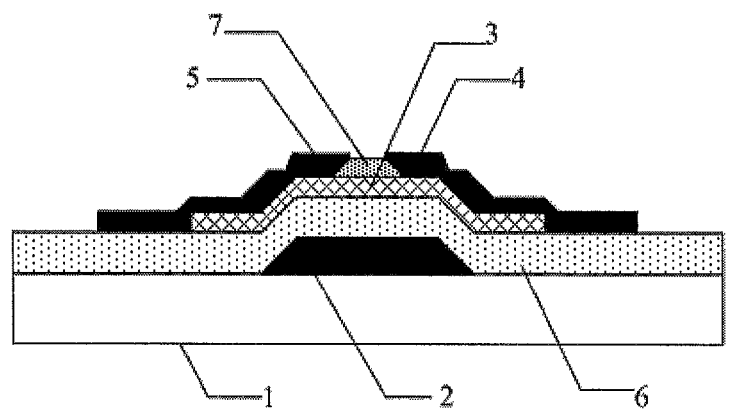
FIG. 1 is a schematic structural view of a thin film transistor according to an embodiment of the present disclosure.

As illustrated in FIG. 1, an embodiment of the present disclosure provides a thin film transistor comprising a base substrate 1, and a gate 2, an active layer 3, a drain 4 and a source 5 formed on the base substrate 1, wherein the active layer 3 is made of an amorphous phosphide semiconductor material.

In the thin film transistor according to the embodiment of the present disclosure, the active layer is made of an amorphous phosphide semiconductor material. Since the carries mobility of the phosphide semiconductor material is high, the carrier mobility of the thin film transistor with the active layer made of amorphous phosphide semiconductor material is higher with respect to the conventional thin film transistor with the active layer material made of amorphous silicon, poly silicon, microcrystalline silicon or oxide semiconductor material.

In the thin film transistor according to the embodiment of the present disclosure, a thickness of the active layer is usually controlled between 5 nm -200 nm In the thin film transistor according to the embodiment of the present disclosure, the active layer can be amorphous binary phosphide semiconductor material, such as InP, $Zn_3P_2$, $Ga_3P_2$, and may be amorphous multi-element phosphide semiconductor material, such as InGaZnP or InGaZnOP, and it is not limited herein. The amorphous binary phosphide semiconductor material refers to amorphous binary compound semiconductor material composed of metals element or non-metal elements and phosphor, while the amorphous multi-element phosphide semiconductor material refers to amorphous multiple compound semiconductor material composed of a plurality of metal elements and/or non-metal elements and phosphor.

Further, the active layer of the thin film transistor according to the embodiment of the disclosure can also be made of amorphous compound doped with phosphor semiconductor material, which in practice, may realize a high carrier mobility by adjusting portion of phosphor element doped in the amorphous compound semiconductor material, which will not be described in details.

The thin film transistor with a bottom gate type structure is illustrated as an example in FIG. 1. However, the thin film transistor TFT device according to the embodiment of the present disclosure can be applied to various structures, that is, the TFT device can have a bottom gate type structure, a top gate type structure, an normal staggered type structure, a inverted-staggered type structure, a coplanar type structure or a inverted-coplanar type structure, which will not be defined here.

In the thin film transistor according to the embodiment of the present disclosure, the base substrate can be made of a transparent material, such as glass or quartz, the base substrate can also be made of other opaque materials, such as ceramics or metals, which will not be defined here.

Further, in the thin film transistor according to the embodiment of the present disclosure, the gate can be made of a metal material such as Mo, Al or Cr, can also be made of an alloy material, or can be made of a composite metal layer such as Mo/Al, which will not be defined here. When implemented, a thickness of the gate is usually controlled between 1 nm-500 nm.

Further, as illustrated in FIG. 1, the thin film transistor according to the embodiment of the present disclosure can further comprise a gate insulating layer 6 formed between the gate 2 and the active layer 3. For example, the gate insulating layer 6 can be made of an insulating material such as silicon oxide, silicon nitride, and a thickness of the gate insulating layer 6 is usually controlled between 1 nm-300 nm.

Further, as illustrated in FIG. 1, the thin film transistor according to the embodiment of the present disclosure can further comprise an etch barrier layer 7 formed between the active layer 3 and the drain 4, the source 5. For example, the etch barrier layer 7 can be made of silicon oxide, silicon nitride or an organic insulating material, and a thickness of the etch barrier layer 7 is usually between 5 nm -500 nm.

For example, in the thin film transistor according to the embodiment of the present disclosure, the drain and the source can respectively be made of a metal material such as Mo, Al or Cr, or can be made of an alloy material, or can also be made of a composite metal layer such as Mo/Al. It is not limited here. Thicknesses of the source and the drain are usually controlled between 1 nm-500 nm, respectively.

Based on the same conception, embodiments of the present disclosure also provide an array substrate comprising the thin film transistor according to embodiments of the present disclosure. The skilled person in the art may implement the array substrate upon reading embodiments of the said thin film transistor, and no further description will be given here.

Figure 2:
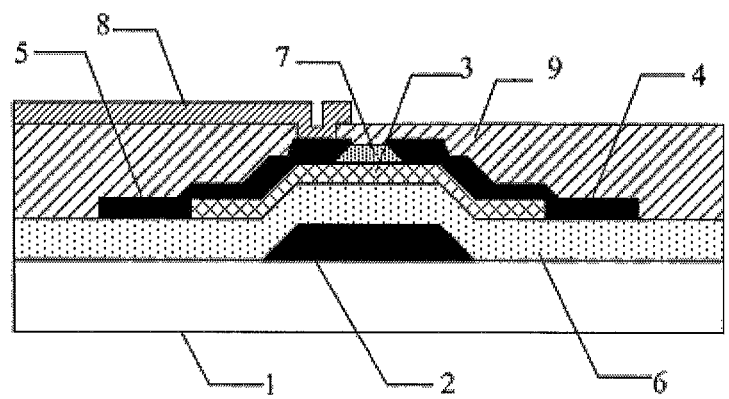
FIG. 2 is a schematic structural view of an array substrate according to an embodiment of the present disclosure.

FIG. 2 is a schematic structural view of the array substrate according to an embodiment of the present disclosure. As illustrated in FIG. 2, the array substrate according to the embodiment of the present disclosure can comprise a pixel electrode 8 formed on the thin film transistor and connected to the source 5.

Further, as illustrated in FIG. 2, the array substrate according to the embodiment of the present disclosure can also comprise: a passivation layer 9 formed between the source 5 and the pixel electrode 8, the pixel electrode 8 connected to the source 5 through via holes in the passivation layer 9. The passivation layer 9 can be made of an insulating material such as silicon oxide, silicon nitride or organic materials, and a thickness of the passivation layer 9 is usually controlled between 5 nm-500 nm.

Furthermore, on the basis of actual requirement, the array substrate according to the embodiment of the present disclosure can also comprise a buffer layer disposed between the base substrate and the gate, a planarization layer and a pixel defining layer disposed on the pixel electrode, and the like, which will not be defined herein.

The array substrate according to the embodiment of the present disclosure can be applied to liquid crystal display (LCD) panels, of course can also be applied to organic light emitting diode (OLED) display panels, which will not be defined herein.

Based on the same conception, embodiments of the present disclosure also provide a display panel comprising the array substrate. The display panel can be a LCD panel or an OLED display panel. Other necessary components for a display panel are those considered as necessary by those skilled in the art, and will not be described abundantly and will not be construed as a limitation to the present disclosure. The display panel can be implemented by referring to embodiments of the array substrate, the description thereof will not be repeated.

If the display panel according to an embodiment of the present disclosure is an OLED display panel, the OLED display panel can also comprise an anode, a hole transport layer, an organic light emitting layer, an electrode transport layer and a cathode, sequentially formed over the array substrate, and of course, other film layers can also be provided as needed, which will not be defined herein.

Based on the same conception, embodiments of the present disclosure also provide a method for manufacturing an thin film transistor. When manufacturing the thin film transistor, the active layer is made of an amorphous phosphide semiconductor material, specifically, prepared by means of magnetron sputtering, pulsed laser deposition, chemical vapor deposition or solution deposition.

If the active layer is made of InGaZnP, patterns of the active layer can be prepared by means of magnetron sputtering. The method comprises, in an oxygen atmosphere at a pressure of 1 Pa-10 Pa, depositing an InGaZnP film by means of magnetron sputtering; usually controlling a thickness of the InGaZnP thin film to about 50 nm; annealing the InGaZnP film for one hour in the air atmosphere at a temperature of 100° C.-600° C.; and patterning the InGaZnP film to form patterns of the active layer. Further, the InGaZnP film is annealed for one hour in an air atmosphere at a temperature of 100° C.-400° C.

Figure 3A:
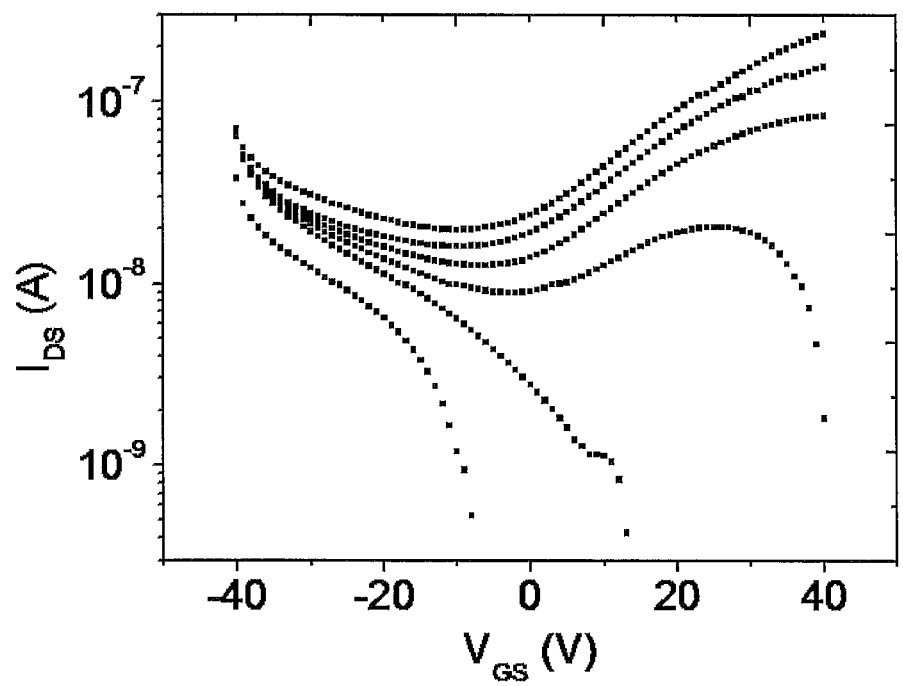
FIG. 3a is a transfer characteristic graph of a thin film transistor according to an embodiment of the present disclosure.
Figure 3B:
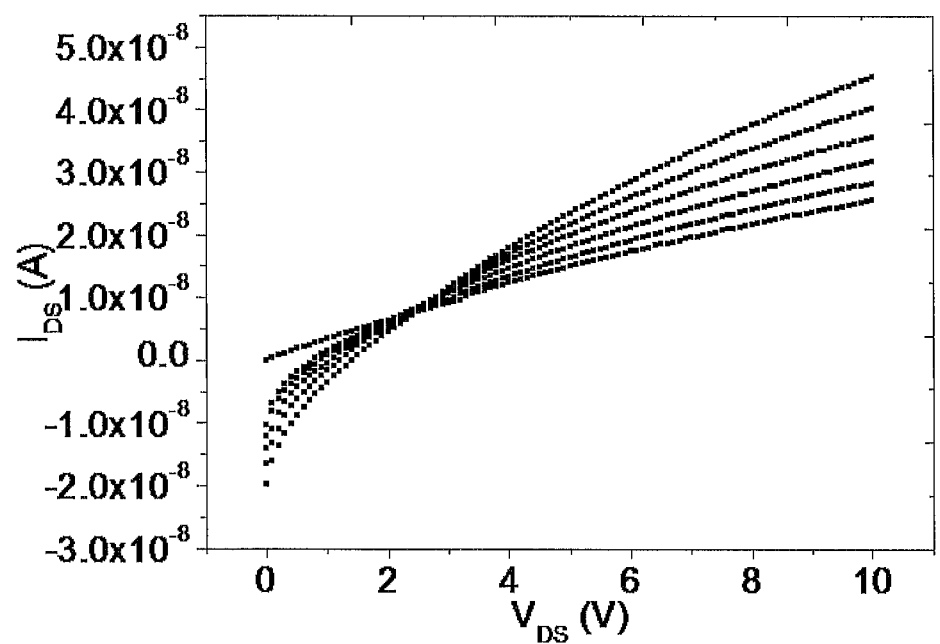
FIG. 3b is an output characteristic graph of a thin film transistor according to an embodiment of the present disclosure.
Figure 4:
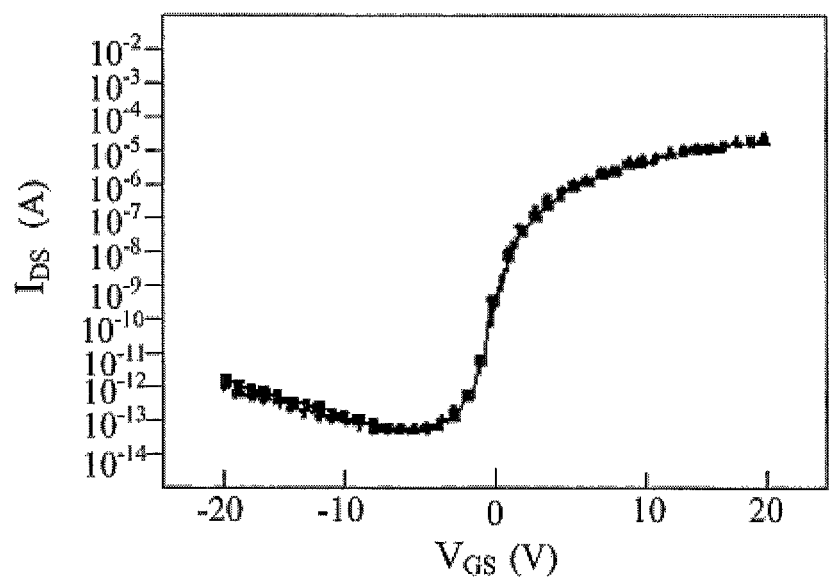
FIG. 4 is an output characteristic graph of an amorphous thin film transistor according to conventional technologies.

If the active layer is made of InP, patterns of the active layer can be prepared by means of pulsed laser deposition. The method comprises, depositing an InP film, in an oxygen atmosphere at a pressure of 1 Pa-10 Pa, by means of the pulsed laser deposition; usually controlling a thickness of the InP thin film to about 50 nm; annealing the InP film for 10 minutes in an air atmosphere at a temperature of 100° C.-600° C.; and patterning the InP film to form patterns of the active layer. Further, the InP is annealed for 10 minutes in an air atmosphere at a temperature of 100 ° C.-400° C. Operation characteristic graphs of the amorphous InP thin film transistor prepared in the way above are illustrated in FIGS. 3a and 3b, from which it can be seen that the carrier mobility of the thin film transistor is higher. The device is not optimized yet, and the carrier mobility has reached the level of the amorphous thin film transistor. FIG. 4 is an output characteristic graph of a conventional amorphous thin film transistor.

Further, the thin film transistor manufactured by the above preparing method can be applied to LCD panels, and of course can also be applied to OLED display panels, and it will not be defined herein. Each step of the preparing process of the thin film transistor will be explained in detail through two examples below. In both examples, explanation is made by taking the thin film transistor with a bottom gate type structure as an example.

EXAMPLE 1

The thin film transistor is applied to an active matrix organic light emitting diode (AMOLED) display panel A method for preparing the thin film transistor comprises following step specifically:

Step S01, forming patterns of a gate on a base substrate.

The gate is usually prepared by means of a magnetron sputtering, and the patterns of the gate are formed by a patterning process. The gate can be made of Mo. Further, a thickness of the gate can be controlled to about 200 nm.

Before preparing the patterns of the gate in step S01, as needed, the preparing method can further comprise a step of forming a buffer layer on the base substrate.

The base substrate can be cleaned through a standard method, and then the buffer layer is deposited on the base substrate by means of CVD. The buffer layer can be made of $SiO_2$. Further, a thickness of the buffer layer is usually controlled to about 200 nm.

Step S02, forming a gate insulating layer on the gate.

Usually, the gate insulating layer is prepared by means of CVD. Specifically, the gate insulating layer can be made of $SiO_2$. Further, a thickness of the gate insulating layer can be controlled to about 150 nm.

Step S03, forming patterns of an active layer on the gate insulating layer.

The active layer can be made of InGaZnP, and the patterns of the active layer can be prepared by means of the magnetron sputtering: first, in an oxygen atmosphere at a pressure of 1 Pa-10 Pa, depositing an InGaZnP film by means of the magnetron sputtering; controlling a thickness of the InGaZnP film to about 50 nm; annealing the InGaZnP film for one hour in an air atmosphere at a temperature of 100° C.-600° C.; and forming patterns of the active layer through a patterning process.

Further, the InGaZnP film is annealed for one hour in an air atmosphere at a temperature of 100° C.-400° C.

Step S04, forming patterns of an etch barrier layer on the active layer.

The etch barrier layer is usually prepared by CVD, and the patterns of the etch barrier layer is formed through a patterning process. The etch barrier layer can be made of $SiO_2$. Further, a thickness of the etch barrier layer is usually controlled to about 50 nm Step S05, forming patterns of a source and a drain on the etch barrier layer.

The source and the drain are usually prepared by means of sputtering, and the patterns of the source and the drain is formed through one patterning process. The source and the drain can be made of a composite metal layer of Mo/Al. Further, thicknesses of the source and the drain are usually controlled to about 200 nm respectively.

After the thin film transistor is formed, following steps are required to form the structure of an AMOLED.

Step S06, forming patterns of a passivation layer on the source and the drain.

The passivation layer is prepared usually by means of CVD. The passivation layer can be made of $SiO_2$, and via holes are usually formed in the passivation layer through dry etching to connect a pixel electrode to be formed with the source. Further, a thickness of the passivation layer is usually controlled between 100 nm-500 nm.

Step S07, forming patterns of the pixel electrode on the passivation layer, the pixel electrode connected to the source through via holes in the passivation layer.

The pixel electrode layer is usually prepared by means of sputtering, and the patterns of the pixel electrode are formed through a patterning process. The pixel electrode can be made of ITO.

Step S08, spin-coating and depositing a pixel defining layer of an acrylic material on the pixel electrode and then forming patterns of the pixel defining layer through a patterning process. A thickness of the pixel defining layer can be controlled to about 1.5 µm.

After the step S08, the method can further comprise following steps :

Step S09, forming a hole transport layer.

The hole transport layer is prepared through thermal evaporation deposition in an OLED or EL organic metal thin film deposition high vacuum system at a pressure of $1 \times 10^{-5}$ Pa and at a temperature of about 170° C. The hole transport layer can be made of NPB (N,N'-diphenyl-N-N'-2(1-naphnyl)-1,1'diphenyl-4,4'-diamine). A thickness of the hole transport layer is usually controlled to about 50 nm Step S10, forming patterns of an organic light emitting layer on the hole transport layer.

The organic light emitting layer is prepared through thermal evaporation deposition in an OLED or EL (electrolumiescent) organic metal thin film deposition high vacuum system at a pressure of $1 \times 10^{-5}$ Pa. It is also possible to form sequentially arranged green sub-pixel region, blue sub-pixel region and red sub-pixel region through a divided pixel region mask vapor deposition process. Materials of the green, blue and red pixel regions of the organic light emitting layer can adopt a bulk material doped with phosphorescent materials, such as CBP: (ppy)2Ir(acac), CBP: FIrpic and CBP: Btp2Ir(acac). A thickness of the organic light emitting layer is usually controlled to about 25 nm.

Step S11, forming an electron transport layer on the organic light emitting layer.

The electron transport layer is prepared through thermal evaporation deposition in an OLED or EL organic metal thin film deposition high vacuum system at a pressure of $1\times10^{-5}$Pa and at a temperature of about 190° C. The electron transport layer can be made of Bphen. A thickness of the electron transport layer is usually controlled to about 25 nm.

Step S12, forming a cathode on the electron transport layer.

The cathode is prepared through thermal evaporation deposition in an OLED or EL organic metal thin film deposition high vacuum system at a pressure of $1\times10^{-5}$ Pa and at a temperature of about 190° C. The material of the cathode may be a composite metal layer of Sm/Al. A thickness of the cathode is usually controlled to about 200 nm.

EXAMPLE 2

The thin film transistor is applied to a LCD display panel, and a method for manufacturing the thin film transistor comprising following step:

Step S01, forming patterns of a gate on a base substrate.

The gate is prepared by means of a magnetron sputtering, and patterns of the gate are formed throuhg a patterning process. Specifically, material for the gate can be Mo. A thickness of the gate can be controlled to about 200 nm.

Before step S01 of preparing the patterns of the gate, as needed, the method can further comprise a step of forming a buffer layer on the base substrate.

The base substrate can be cleaned by means of a standard method, and then the buffer layer is deposited on the base substrate through CVD. The buffer layer can be made of $SiO_2$. A thickness of the buffer layer is usually at best controlled to about 200 nm.

Step S02, forming a gate insulating layer on the gate.

The gate insulating layer is prepared by means of CVD. The gate insulating layer can be made of $SiO_2$. A thickness of the gate insulating layer can be controlled to about 150 nm.

Step S03, forming patterns of an active layer on the gate insulating layer.

Material of the active layer can specifically be InP, and the patterns of the active layer can be prepared by means of the magnetron sputtering: transferring the substrate into a vacuum cavity with a vacuum degree of $(1-10)\times10^{-4}$Pa, then supplying an oxygen of 5-30 sccm, for example, 5 sccm, 10 sccm, 20 sccm or 30 sccm, so as to control the pressure of the vacuum cavity to 0.5-1.5 Pa such as 0.5 Pa, 1 Pa or 1.5 Pa; employing a pulsed laser with a frequency of 1-10 Hz and a pulse energy of 200-500 mJ such as 5 Hz of the frequency of the pulse laser and 350 mJ of the pulse energy, to deposit the InP thin film for 1-5 minutes such as 1 minute, 2 minutes, 3 minutes or 5 minutes; controlling a thickness of the InP between about 30 nm to about 80 nm, such as 30 nm, 50 nm or 80 nm; then in an air atmosphere at a temperature of 100° C.-600° C., and further in an air atmosphere at a temperature of 100° C.-400° C., such as 100° C., 300° C., 500° C. or 600° C., annealing the InP thin film for 5-20 minutes, and the annealing time being 5 minutes, 10 minutes, 15 minutes or 20 minutes; and finally forming patterns of the active layer through a patterning process.

Step S04, forming patterns of an etch barrier layer on the active layer.

The etch barrier layer is prepared by means of CVD, and the patterns of the etch barrier layer is formed through a patterning process. The etch barrier layer can be made of $SiO_2$. A thickness of the etch barrier layer is usually controlled to about 50 nm at best.

Step S05, forming patterns of a source and a drain on the etch barrier layer.

In implementation, the source and the drain are prepared by means of sputtering and the patterns of the source and the drain through one patterning process. The source and the drain can be made of a composite metal layer Mo/Al. Thicknesses of the source and the drain are usually controlled to about 200 nm at best, respectively.

After forming the thin film transistor is formed, following steps are required to form the pixel structure of LCD, and specifically comprises:

Step S06, forming patterns of a passivation layer on the source and the drain.

The passivation layer is prepared usually by means of CVD. The passivation layer can be made of $SiO_2$, and via holes are usually formed in the passivation layer through dry etching to connect a pixel electrode to be formed with the source. A thickness of the passivation layer is usually controlled between 100 nm-500 nm at best.

Step S07, forming patterns of a pixel electrode on the passivation layer, the pixel electrode being connected to the source through via holes in the passivation layer;

The pixel electrode layer is usually prepared by means of sputtering, and the patterns of the pixel electrode are formed through a patterning process. The pixel electrode can be made of ITO.

After completing the step S07, it is also required to perform PI coating, impression orientation and prepare spacers, prepare a color film substrate provided opposing to the TFT array substrate, and cell-assemble the color film substrate and the TFT array substrate, implant liquid crystal molecules, and coat seal agent etc. All the processes belong to conventional technologies and will not be described any more.

In the thin film transistor, the method for manufacturing the thin transistor and the relevant device according to embodiments of the present disclosure, the active layer of the thin film transistor are made of the amorphous phosphide semiconductor materials. Due to the high carriers mobility of the phosphide semiconductor material, a thin film transistor with a higher carrier mobility can be obtained by employing the amorphous phosphide semiconductor material to prepare the active layer of the thin film transistor, compared to a conventional thin film transistor with an active layer made of amorphous silicon, poly silicon, microcrystalline silicon or oxide semiconductor material.

The foregoing are merely exemplary embodiments of the disclosure, but are not used to limit the protection scope of the disclosure. The protection scope of the disclosure shall be defined by the attached claims.

The invention claimed is:

1. A method for manufacturing a thin film transistor which comprising a base substrate, and a gate, an active layer, a source and a drain formed on the base substrate, wherein a material for the active layer is an amorphous phosphide semiconductor material, wherein the material of the active layer is InGaZnP, patterns of the active layer are prepared by means of magnetron sputtering, and the method comprises:

depositing an InGaZnP thin film in an oxygen atmosphere at a pressure of 1 Pa-10 Pa;

annealing the InGaZnP thin film for an hour in an air atmosphere at a temperature of 100° C-600° C.; and patterning the InGaZnP thin film and forming the patterns of the active layer.

2. The method according to claim 1, wherein the InGaZnP thin film is annealed for an hour in an air atmosphere at a temperature of 100° C-400° C.

3. The method according to claim 1, wherein a thickness of the active layer is between 5nm and 200nm.

* * * * *